United States Patent [19]

Suzuki et al.

[11] Patent Number: 5,015,314
[45] Date of Patent: May 14, 1991

[54] METHOD FOR PRODUCTION OF CERAMIC CIRCUIT BOARD

[75] Inventors: Hitoshi Suzuki, Zama; Hiromitsu Yokoyama, Sagamihara; Mineharu Tsukada, Yamato; Hiromi Ogawa, Yokohama; Nobuo Kamehara, Isehara; Koichi Niwa, Tama, all of Japan

[73] Assignee: Fujitsu Limited, Kawasaki, Japan

[21] Appl. No.: 469,739

[22] Filed: Jan. 19, 1990

Related U.S. Application Data

[63] Continuation of Ser. No. 132,075, Dec. 11, 1987, abandoned.

[30] Foreign Application Priority Data

Dec. 17, 1986 [JP] Japan ............... 61-298889

[51] Int. Cl.⁵ ............................................. C04B 41/82
[52] U.S. Cl. .......................................... 156/89; 264/61
[58] Field of Search ........................... 264/61; 156/89

[56] References Cited

U.S. PATENT DOCUMENTS

| | | | |
|---|---|---|---|
| 4,503,090 | 3/1985 | Brown et al. | 427/96 |
| 4,504,339 | 3/1985 | Kamehara et al. | 156/89 |
| 4,594,181 | 6/1986 | Siuta | 252/512 |
| 4,679,320 | 7/1987 | Imanaka et al. | 156/89 |
| 4,772,346 | 9/1988 | Anderson | 156/89 |

FOREIGN PATENT DOCUMENTS 0177772 4/1986 European Pat. Off. .
58-74759 5/1983 Japan .
59-155988 9/1984 Japan .

*Primary Examiner*—James Derrington
*Attorney, Agent, or Firm*—Armstrong, Nikaido Marmelstein Kubovcik & Murray

[57] ABSTRACT

A method for producing a ceramic circuit board comprising the steps of (i) forming a conductor portion of the ceramic circuit board by printing a conductive paste composition on a ceramic base plate for the circuit board and then (ii) firing the ceramic base plate and the conductive paste composition together, wherein a copper-base composition comprising a copper powder and 0.5 to 5 parts by weight, based on 100 parts by weight of copper powder, of at least one organo metallic compound capable of forming an inorganic compound or compounds, respectively, when fired in an inert atmosphere, is used as the conductive paste composition.

The combined use of isopropyl tridodecylbenzene sulfonyl titanate and isopropyl triisostearoyl titanate greatly improve the flowability of the copper-base conductive paste composition.

3 Claims, 3 Drawing Sheets

METHOD FOR PRODUCTION OF CERAMIC CIRCUIT BOARD

This application is a continuation of U.S. application Ser. No. 132,075 filed 12/11/87, now abandoned.

BACKGROUND OF THE INVENTION

1. Field of the Invention

The present invention relates to a method for producing a ceramic circuit board More specifically, it relates to a method for producing a multilayer glass ceramic copper circuit board having an improved printing property and adhesion property, without adversely affecting the conditions of through-holes therein, by using a copper-base conductive paste composition

2. Description of the Related Art

Glass ceramic composite multilayer circuit boards having superior electrical characteristics can include a copper conductive layer, since the boards can be fired or baked at a relatively low temperature (e.g., 1000° C. or less) to greatly improve the conductivity of the boards. However, known copper-base pastes used to form conductors have been developed mainly for use with alumina circuit boards and, therefore, have not been directly applied to multilayer glass-ceramic circuit boards. Nevertheless, the development of glass-ceramic circuit boards having good electric characteristics is progressing and, therefore, there is a need to develop conductive copper paste compositions suitable for use in glass-ceramic composite circuit boards in the form of a green sheet before firing, having good printing properties, excellent adhesion properties, and further, capable of entirely filling through holes in the boards.

Various conductive paste compositions are known and used in the art. For example, paste compositions containing a conductor component of a noble metal such as gold, silver, and palladium dispersed in organic vehicles, paste compositions containing a conductor component of a high-melting point metal such as tungsten and molybdenum dispersed in organic vehicles, and paste compositions containing a conductor component of copper dispersed in organic vehicles Of the above-mentioned conductive paste compositions, the conventional copper paste compositions which can be fired at a relatively low temperature generally contain copper powder, glass powder, and an organic vehicle. Namely, generally 1% to 5% by weight, based on the weight of the copper powder (i.e., conductor component), of the glass powder is contained, to provide the required adhesion strength with the binder and the substrate, and the organic vehicle is contained so that the glass powder can be made into a paste by mixing therewith.

For example, JP-A-59-155988 (Kokai) discloses a method for producing a conductive paste composition for coating a thicker film or layer containing gold, silver, copper, platinum, palladium, nickel, and/or aluminum powder and an organic vehicle by mixing in the presence of a titanate coupling agent However, this paste is used only for alumina substrates and the titanate coupling agent is used to prevent the formation of metal flakes.

JP-A-58-74759 (Kokai) discloses a conductive copper paste composition containing copper powder, a thermosetting resin binder, an unsaturated fatty acid, and an organic titanium compound However, the organic titanium compound is used, together with the unsaturated fatty acid, to ensure a fine dispersion of the copper powder and to provide a stable and good conductivity.

U.S. Pat. No. 4,503,090 discloses a thick film resistor circuit formed from a paste containing copper, silver and aluminum, a binder, ethyl cellulose, and a solvent.

When the above known conductive paste compositions are used as a conductor component, however, the following disadvantages arise.

(1) The paste compositions containing a noble metal as a conductor component are expensive and, therefore, are not preferable in practice (2) The paste compositions containing a metal having a high melting point cannot be fired at a relatively low temperature and, since the resistivity of the conductor component is high, the conductor has a poor quality.

(3) Although the development of paste compositions having copper as the conductor component is very desirable, the properties when printed on a green sheet of glass-ceramic composite substrate are poor and the adhesion strength after the integral firing is low. Furthermore, although it has been proposed that a small amount of glass having a low melting point be added, to improve the adhesion strength, this is not substantially effective for glass-ceramic composite substrates. Furthermore, when a small amount of glass powder having a low melting point is added, the copper powder has little or no flowability, and during the printing, the copper-base paste composition is not easily filled into through-holes in a glass-ceramic green sheet.

SUMMARY OF THE INVENTION

Accordingly, an object of the present invention is to solve the above-mentioned problems of the prior art and to provide a method for producing a ceramic circuit board, by using a copper-base conductive paste composition, having improved printing and adhesion properties, and having other properties such that the copper-base conductive paste composition can be easily filled into through holes in a glass-ceramic green sheet before firing.

Other objects and advantages of the present invention will be apparent from the following description.

In accordance with the present invention, there is provided a method for producing a ceramic circuit board comprising the steps of (i), forming a conductor portion of the ceramic circuit board by printing a conductive paste composition on a ceramic base plate for the ceramic circuit boards and then (ii) firing the ceramic base plate and the conductive paste composition, wherein a copper-base composition comprising a copper powder as a main component, and 0.5 to 5 parts by weight, based on 100 parts by weight of copper powder, of at least one organo metallic compound capable of forming an inorganic compound or compounds, respectively, when fired in an inert atmosphere, is used as the conductive paste composition.

In accordance with the present invention, there is also provided a method for producing a multilayer ceramic circuit board comprising the steps of (i), forming a conductor portion of the ceramic circuit board by printing a conductive paste composition on the circuit board and then (ii) firing the combined board and pastes, wherein a composition comprising a copper powder and a vehicle composed of a binder, an organic thixotropicity-providing agent, an alcoholic solvent, and 0.5 to 3.5 parts by weight of isopropyl tridodecylbenzene sulfonyl titanate and 0.5 to 3.5 parts by weight of isopropyl triisostearoyl titanate, both based on 100 parts by weight of the copper powder, is used as the conductive base board.

BRIEF EXPLANATION OF THE DRAWINGS

The present invention will be described in more detail below with reference to the drawings, in which.

DESCRIPTION OF THE PREFERRED EMBODIMENTS

Figure 1:
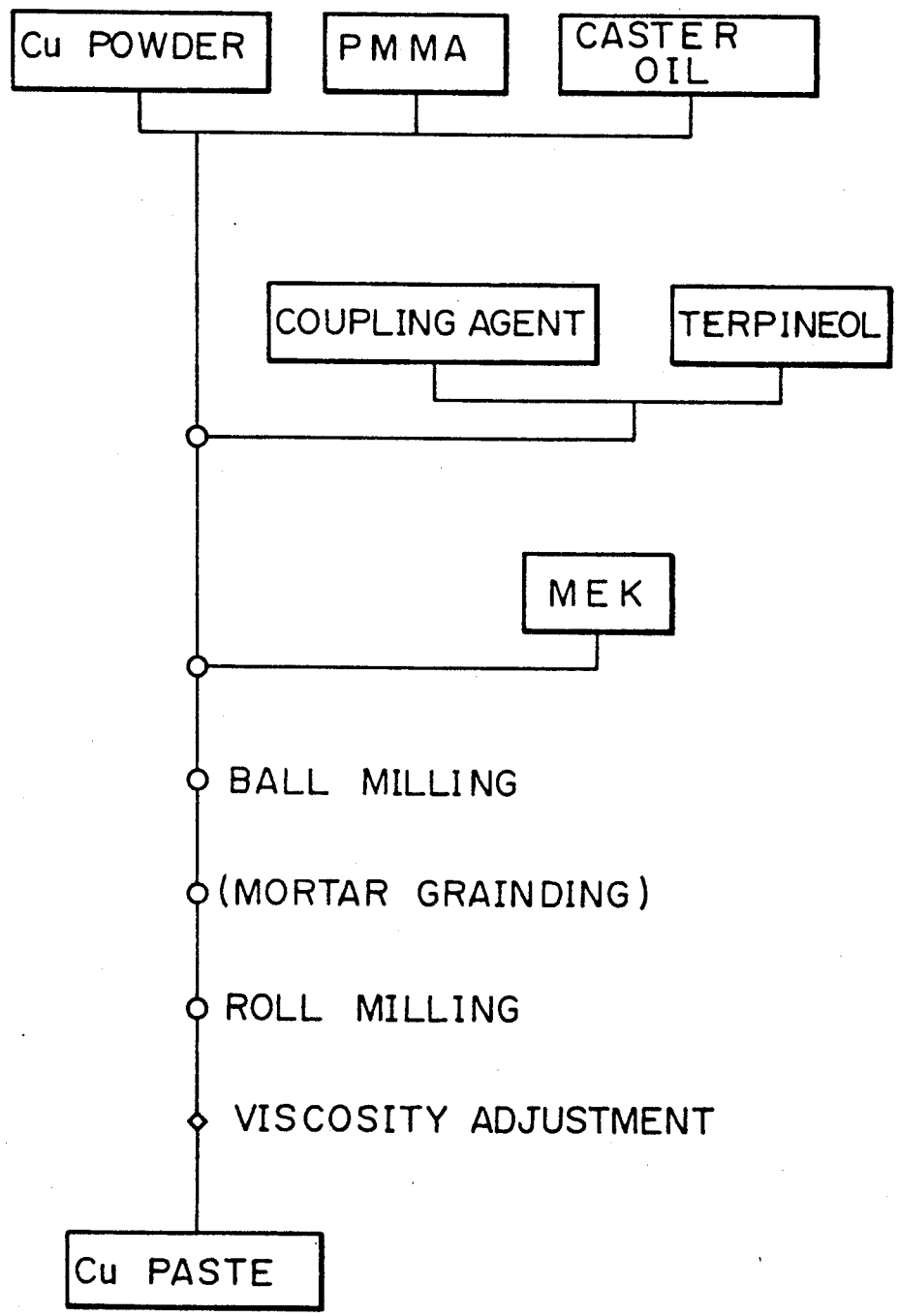
FIG. 1 shows a typical process block diagram illustrating the basic steps for preparing the copper base paste of the present invention.

As mentioned above, according to the present invention, a copper-base paste composition comprising 0.5 to 5 parts by weight, based on 100 parts by weight of copper powder, of an organo metallic compound, especially an organic titanate or aluminate compound capable of forming an inorganic compound, especially an inorganic titanium or aluminum compound (e.g., $TiO_2$ or $Al_2O_3$), respectively, when fired in an inert atmosphere (e.g., an inert gas or nitrogen) is used.

The copper powder used in the paste composition may be any copper powder usually used in copper-base conductive paste compositions, such as copper powders having an average particle size of 0.1 to 10 μm.

The organic titanate compounds usable in the present invention include, for example, isopropyl tridodecylbenzene sulfonyl titanate, isopropyl triisostearoyl titanate, isopropyl tris(dioctyl pyrophosphate) titanate, bis(dioctyl pyrophosphate)oxyacetate titanate, isopropyl tri(N-aminoethyl-aminoethyl)titanate, tetraisopropyl bis(dioctyl phosphite)titanate, bis(dioctyl pyrophosphate) ethylene titanate, tetraoctyl bis(ditridecyl phosphite) titanate, and isopropyl tri(dioctyl phosphate) titanate. The preferable compounds are isopropyl tridodecylbenzene sulfonyl titanate and isopropyl tris(dioctyl pyrophosphate) titanate.

The organic aluminate compounds usable in the present invention include, for example, acetoalkoxy aluminum diisopropylate having the following formula:

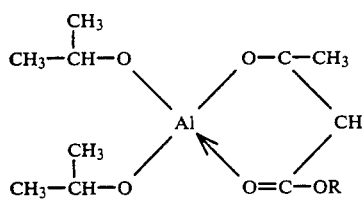

The organic titanate or aluminate compounds is used in an amount of 0.5 to 5 parts by weight, preferably 0.5 to 1 part by weight, based on 100 parts by weight of the copper powder. When the amount of the organic titanate or aluminum compound is less than 0.5 parts by weight, the desired paste composition is not obtained. This is thought to be because the entire surfaces of the copper powder particles are not coated by the organic titanate or aluminate compound. Conversely, when the amount is more than 5 parts by weight, the excess amount of the organic compound remains in the paste composition and will cause voids to appear in the conductor.

The copper-base conductive paste composition according to the present invention can be prepared by first dissolving the organic titanate or aluminate compound in a solvent such as an alcoholic high boiling point solvent (e.g., terpineol, 2-butoxyethanol, 2-hexyloxyethanol, 4-methylcyclohexanol, 3-methylcyclohexanol, and/or 2-hexyloxy ethanol) and then thoroughly mixing the resultant organic vehicle with the copper powder, while stirring, to produce the desired copper-base conductive paste composition in the form of a dispersion having a viscosity of 10,000 to 200,000 c.p.

The copper-base conductive paste composition according to the present invention can be applied to a glass-ceramic substrate such as ceramic composites of borosilicate glass and alumina, zirconia, or magnesia in any conventional manner.

According to the present invention, since the entire surfaces of the copper powder particles in the copper-base paste composition are covered with, for example, the organic titanate having a monoalkoxy group, the flowability between the copper powder particles is good. Furthermore, a green sheet of a glass-ceramic composite substrate to be printed contains a large amount of a solvent, and thus the wetability of the conductive paste composition to the green sheet is increased. Furthermore, since the organic titanate typically represented by isopropyl tridodecylbenzene sulfonyl titanate is converted to rutile typetitanium dioxide ($TiO_2$) when the copper-base paste composition is fired in an inert atmosphere such as nitrogen, the adhesion strength at the interface between the copper conductor and the glass-ceramic substrate is greatly improved. In the case of the organic aluminate compound, aluminum oxide($Al_2O_2$) is formed.

Figure 2:
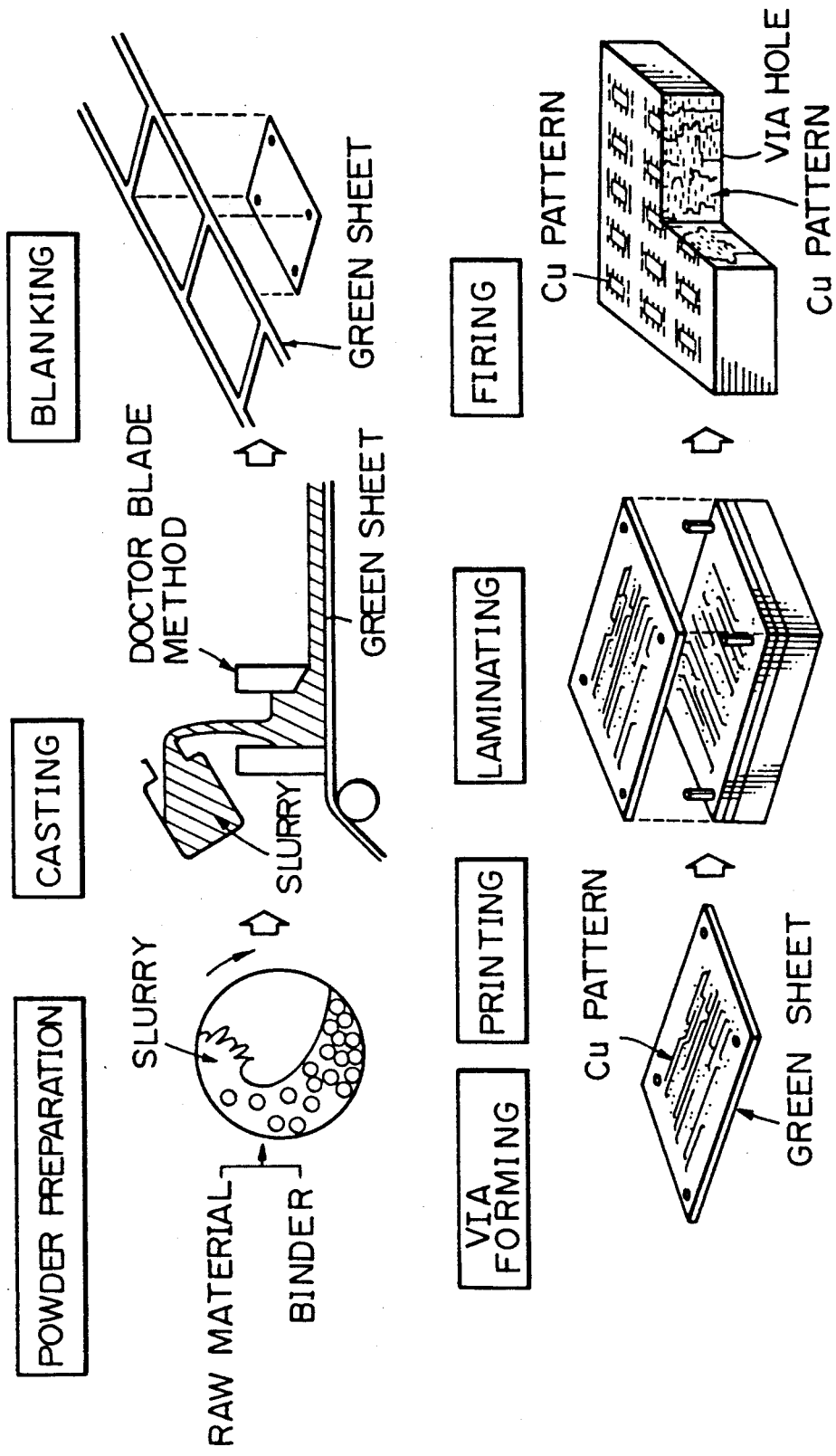
FIG. 2 shows a process diagram illustrating the basic steps for manufacturing a multilayer ceramic circuit board with the copper conductor of the present invention.

FIG. 1 shows a typical process block diagram illustrating the basic steps for forming a copper base paste of the present invention. An example of a process diagram illustrating the basic steps for manufacturing a multilayer ceramic circuit board with copper conductor of the present invention is shown in FIG. 2.

It is feasible that the multilayered structure be formed such that the patterns of copper-based conductors and the glass-ceramic paste are alternately printed on a sintered ceramic substrate, the glass-ceramic paste layers having openings to form through-holes therethrough.

It is advantageous that the multilayered structure be formed such that a plurality of composite layers is laminated, each layer being produced by printing patterns of copper-based conductors on a glass-ceramic green sheet, which contains the thermally depolymerizable resin and minute copper balls are filled in a row penetrating or by printing copper base paste to the opening as through-holes through the glass-ceramic green sheet. It is applicable that firing process comprises prefiring the multilayer structure in an inert atmosphere containing water vapor, the partial pressure of which is 0.005 to 0.3 atmosphere, at a temperature at which the thermally depolymerizable resin is eliminated; and firing the multilayer structure in an inert atmosphere containing no water vapor at a temperature below the melting point of copper so as to sinter the glassceramic.

Figure 3:
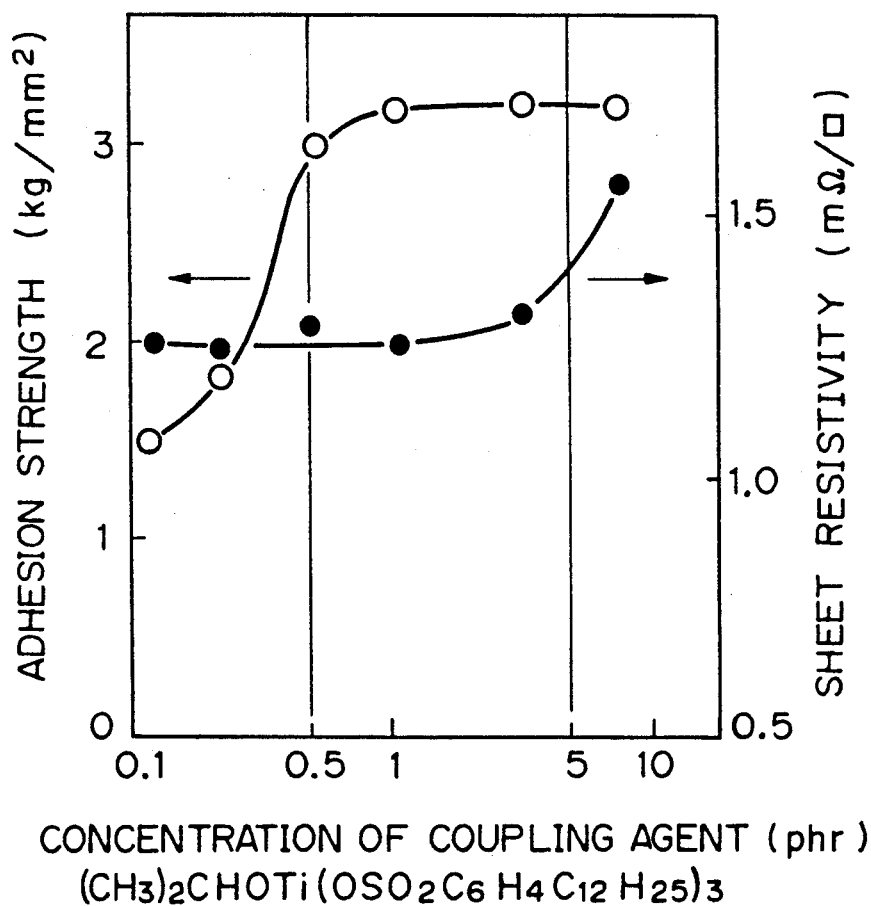
FIG. 3 shows a typical graph of adhesion strength of the copper conductor pattern to glass ceramic substrate and sheet resistivity of the copper conductor pattern as a function of concentration of coupling agent in the copper base paste.

FIG. 3 is a graph of the adhesion strength of the copper conductor pattern to glass-ceramic substrate and the sheet resistivity of the copper conductor pattern, after sintering, as a function of concentration of the coupling agent in the copper base paste. Sintering was done prefiring 870° C.×4hr. in an inert atmosphere containing water vapor and then firing 1020° C.×4hr. in an inert atmosphere not containing water vapor. The composition of the copper base paste used in FIG. 3 was as follows.

| Ingredient | Composition of Cu Paste | |
|---|---|---|
| | Maker | Rate (phr) |
| Cu Powder (φ1.25) | MITSUI KINZOKU | 100.0 |
| PMMA | MITSUBISHI | 1.5 |
| Caster oil | NODA WAX | 0.3 |
| Terpineol | WAKOH JUNYAKU | 10.5 |
| Coupling* Agent | AJINOMOTO | 1.0 |

*(CH₃)₂CHOTi(OSO₂C₆H₄C₁₂H₂₅)₃ Isopropyl tridodecylbenzene sulfonyl titanate

According to the second aspect of the present invention, two types of organic titanate coupling agents, e.g., 0.5 to 3.5 parts by weight, preferably 0.5 to 1 part by weight, of isopropyl tridodecylbenzene sulfonyl titanate and 0.5 to 3.5 parts by weight, preferably 0.5 to 1 part by weight of isopropyl triisostearoyl titanate, both in relation to 100 parts by weight of the copper powder, are contained in the copper-base conductive paste composition, without using a glass frit, which has an adverse affect on the hole filling properties thereof. The isopropyl triisostearoyl titanate contained in the composition improves the flowability of the copper powder during the hole filling, and the isopropyl tridodecylbenzene sulfonyl titanate improves the adhesion properties to the glass-ceramic substrate, as mentioned above.

Thus, the flowability between the copper powder particles is improved by the inclusion of the above-mentioned two types of the titanate coupling agents and, therefore, when the conductive paste composition is made to flow into a through-hole in the green sheet during the printing, since the flowability of the copper-base paste composition is improved and, furthermore, the penetration of the organic vehicle into the green sheet is prevented, the copper-base paste composition can easily flow into the through-hole without causing voids. Furthermore, the adhesion strength is remarkably improved by the action of the two types of the titanate coupling agents, compared to such paste compositions not containing the titanate coupling agents.

In the paste composition, according to the present invention, a vehicle containing any connectional ingredients such as binders, thiotropicity-providing agents, solvents, and other optional ingredients may be used. These ingredients may be used alone or in any mixtures thereof. The amounts of a vehicle in the composition is preferably 5 to 30 parts by weight based on 100 parts by weight of the copper powder.

As mentioned above, and as explained below, according to the present invention, the printing of the copper-base paste composition on the glass-ceramic substrate is remarkably improved and the adhesion between the substrate and the conductor is excellent. Furthermore, especially according to the second aspect of the present invention, a conductor without voids can be obtained, without causing a penetration of the solvent and without an adverse affect on the flowability of the powder particles during the filling of the holes in the board.

EXAMPLES

The present invention now will be further illustrated by, but is by no means limited to, the following Examples and Comparative Examples, wherein all parts and percentages are expressed on a weight basis unless otherwise noted.

EXAMPLE 1

The copper-base paste compositions having the following formulations listed in Table 1 according to the present invention were prepared.

TABLE 1

| | Formulation of Copper-Base Paste | | |
|---|---|---|---|
| | Copper Paste Sample No. | | |
| Component | 1 | 2 | 3 |
| Copper powder (1 μm) | 100 parts | 100 parts | 100 parts |
| Organic vehicle*¹ | 13 parts | 13 parts | 13 parts |
| Organic titanate*² | 0.5 parts | 1.0 parts | 1.5 parts |
| Viscosity (poise) | 400–600 | 400–600 | 400–600 |

*¹: Mixture of terpinol, poly(methyl methacrylate) resin, and castor oil
*²: Isopropyl tridodecylbenzene sulfonyl titanate The copper-base paste composition Sample Nos. 1 to 3 were prepared as follows.

That is, the isopropyl tridodecylbenzene sulfonyl titanate was dissolved in a high boiling point alcoholic solvent (i.e., terpineol) at a temperature of 25° C., followed by adding thereto a thixotropy providing agent (i.e., castor oil) and an organic depolymerizable binder (PMMA). Thus, the organic vehicle was prepared. The copper powder having a particle size of 1.5 μm was mixed into the organic vehicle and the resultant mixture was mixed by a wet ball mill mixing at room temperature for 48 hours, followed by drying and then mixing or kneading in a three-roll mill.

The copper-base paste composition Sample Nos. 1 to 3 were evaluated with respect to their characteristics by using a glass-ceramic substrate composed of borosilicate glass and alumina as follows.

That is, the above-prepared copper-base paste composition Sample Nos. 1 to 3 were applied on the surfaces of green sheets of borosilicate glass-alumina composite ceramic having a thickness of 300 μm in a conventional manner under the conditions of a size of a screen mask of 300 mesh, a pattern width of 80 μm, and a squeegee hardness of 80.

The printed paste composition was then dried in a constant temperature bath at a temperature of 70° C. for 30 min to evaporate the solvent 1 the printed green sheet was then pressed in a mold under the conditions of 10 MPa×100° C.×30 min. The resultant laminate having 30 layers was heated from room temperature at a rate of 80°–100° C./hr and allowed to stand for 5 hours at a maximum temperature of 850° C in a nitrogen atmosphere containing water vapor, followed by allowing to cool to room temperature. Thereafter, the resultant laminate was heated from room temperature to a maximum temperature of 1000° C. at a rate of 80° C. to 100° C./hr and allowed to stand at the maximum temperature for 4 hours in a nitrogen atmosphere not containing water vapor, followed by allowing to cool to room temperature. As mentioned above, a typical manufacturing process of the multilayer ceramic board with the copper conductor is shown in FIG. 2.

The results are shown in Table 2.

TABLE 2

Printing Property of Copper-Base Paste
Composition to Borosilicate Glass-Alumina
Composite Ceramic Green Sheet

| Copper Paste Sample | Minimum Pattern Width to Be Printed (μm) | Levelling Property*1 |
|---|---|---|
| 1 | 80 | Good |
| 2 | 80 | Good |
| 3 | 80 | Good |
| 4*2 | 100 | Poor |
| 5*3 | 200 | Poor |
| 6*4 | 100 | Poor |

*1: After printing, soft X-ray was irradiated from the upper side of the print, conductive laminate and the transmission conditions of the X-ray was taken in photographs to use, after enlargement, for the evaluation of the surface undulation conditions of the conductive laminate. This evaluation method is based on the that the transmission conditions of soft X-ray depends upon the thickness of the electrically conductive laminate.
*2: The same paste as that of Sample No. 2, except that no isopropyl tridodecylbenzene sulfonyl titanate was contained
*3: The same paste as that of Sample No. 4, except that 10 parts of glass frit (i.e., borosilicate glass having a softening point of about 700° C.) was contained
*4: Typical commercially available copper paste (i.e., Copper paste ESL-#2310 available from Electro-Science Laboratories, Inc.

The evaluation results of the conductor characteristics of Sample Nos. 1 to 6 are shown in Table 3.

TABLE 3

Conductor Characteristics of Copper-Base Paste when
Applied to Borosilicate Glass-Alumina Ceramic
Composite Substrate

| Copper Paste Sample | Sheet Resistivity of Conductor*1 (mΩ/□) | Adhesion Strength between Substrate and Conductor*2 (kg/mm²) |
|---|---|---|
| 1 | 1.2 | more than 3.2*4 |
| 2 | 1.0 | more than 3.2*4 |
| 3 | 1.0 | more than 3.2*4 |
| 4*3 | 1.2 | 0.5 |
| 5*3 | 1.5 | 2.0 |
| 6*3 | 1.2 | 0 |

*1 $R(m\Omega/\square) = \frac{\text{Resistivity}(\Omega) \times W(100\ \mu m)}{l(10\ cm)} \times \frac{t}{25.4(\mu m)}$ The resistivity of sample conductor having pattern width W(100 μm), a length l of 10 cm, and a thickness t was converted to those having a thickness of 25.4 μm.
*2 Adhesive strength under tension at stress rate of 5 mm/min
*3 See Footnotes of Table 2
*4 Glass-Ceramic substrate was broken.

EXAMPLE 2

Various copper-base paste compositions containing various coupling agents listed in Table 4 were prepared in the same manner as in Sample No. 2 of Example 1.

TABLE 4

| Copper Paste Sample No. | Adhesion Strength between Substrate and Conductor*2 (kg/mm²) | Sheet Resistivity of Conductor (mΩ/□) | Pattern Printing Property |
|---|---|---|---|
| 1*1 | 3.2 | 1.1 | Good |
| 2*2 | 1.0 | 1.1 | Excellent |
| 3*3 | 1.6 | 1.1 | Good |
| 4*4 | 1.0 | 1.1 | Good |
| 5*5 | 0.5 | 1.2 | Good |
| 6*6 | 0.5 | 1.0 | Good |
| 7*7 | 1.0 | 1.2 | Good |
| 8*8 | 0.2 | 1.3 | Good |
| 9*9 | 3.2 | 1.5 | Poor |
| 10*10 | 0.5–1.0 | 1.1 | Good |
| 11*11 | 0 | 1.1 | Excellent |

*1 Isopropyl tridodecylbenzene sulfonyl titanate $(CH_3)_2CHOTi(OSO_2C_6H_4C_{12}H_{25})_3$ (KR-9S available from Ajinomoto Co., Inc.)
*2 Isopropyl triisostearoyl titanate $(CH_3)_2CHOTi(OCOC_{17}H_{35})_3$ (KR-TTS available from Ajinomoto Co., Inc.)
*3 Isopropyl tris(dioctyl pyrophosphate)titanate $(CH_3)_2CHOTi[OPOOHOPOOPO(OC_8H_{17})_2]_3$ (KR-38S available from Ajonomoto Co., Inc.)
*4 Bis(dioctyl pyrophosphate)oxyacetate titanate $$\begin{array}{c} O \\ \parallel \\ C\!\!-\!\!O \\ | \\ CH_2\!\!-\!\!O \end{array} \!\!\! \diagdown\!\!\!\! \diagup \!\!\! Ti\!\!\left[\!\!O\!-\!\!\underset{|}{\overset{O}{\overset{\parallel}{P}}}\!-\!O\!-\!\underset{OH}{\overset{O}{\overset{\parallel}{P}}}\!(\!OC_8H_{17})_2\!\right]_3$$

(KR-138S available from Ajinomoto Co., Inc)
*5 Isopropyl tri(N-aminoethyl-aminoethyl)titanate $(CH_3)_2CHOTi[OC_2H_4NH\text{--}C_2H_4NH_2]_3$ (KR-44 available from Ajinomoto Co., Inc.)
*6 Tetraisopropyl bis(dioctyl phosphite)titanate $[(CH_3)_2CHO]_4Ti[P(OC_8H_{17})_2OH]_2$ (KR-41B available from Ajinomoto Co., Inc.)
*7 Bis(dioctyl pyrophosphate)ethylene titanate $$\begin{array}{c} CH_2\!\!-\!\!O \\ | \\ CH_2\!\!-\!\!O \end{array} \!\!\! \diagdown\!\!\!\! \diagup \!\!\! Ti\!\!\left[\!\!O\!-\!\!\underset{|}{\overset{O}{\overset{\parallel}{P}}}\!-\!O\!-\!\underset{OH}{\overset{O}{\overset{\parallel}{P}}}\!(\!OC_8H_{17})_2\!\right]_3$$

(KR-238S available from Ajinomoto Co., Inc.)
*8 5 phr glass (i.e., borosilicate glass having a softening point of 700° C.) was added instead of the titanate
*9 Titanate coupling agent (i.e., isopropyl-tridodecyl henzene sulfonyl titanate) and 10 phr glass (i.e., borosilicate glass having a softening point of 700° C.)
*10 No titanate coupling agent and no glass were included
*11 Commercially available copper paste ESL 2310 available from Electro-Science Laboratories, Inc.

In the above-mentioned copper-base paste composition samples, the following inorganic compounds were found to be found after firing the copper-base paste composition samples.

In The above-mentioned copper-base paste composition samples, the following inorganic compounds were found to be found after firing the copper-base paste composition samples.

| Sample Nos. 2 and 5: | Ti and TiO₂ |
|---|---|
| Sample Nos. 3 and 6: | TiN and TiO₂ |
| Sample No. 4: | Ti and P-compound |
| Sample No. 1: | TiO₂ |

As is clear from the above-mentioned Examples, the copper-base paste compositions according to the present invention can remarkably increase the adhesion property to the glass-ceramic composite substrates, when compared to the commercially available paste composition containing a small amount of low-melting point glass, and also remarkably improve the printing property, when compared to the commercially available paste composition and also the glass-containing paste composition.

EXAMPLE 3

The copper-base paste composition Sample Nos. 1 and 2 according to the present invention having the compositions, listed in Table 5 were prepared.

TABLE 5

Composition of Copper Paste

| Ingredient | Copper Paste Sample (parts) | |
|---|---|---|
| | 1 | 2 |
| Copper powder (1.5 μmφ) | 100 | 100 |
| Organic vehicle | 13 | 14 |
| Isopropyl tridodecylbenzene sulfonyl titanate | 0.5 | 0.5 |
| Isopropyl tristearoyl titanate | 0.5 | 1 |

These copper paste compositions were prepared as follows.

To the organic vehicle containing an organic solvent (i.e., 2-hexyloxy ethanol, and terpineol), an organic thixotropy providing agent (i.e., castor oil), and a binder (i.e., ethyl cellulose, and poly(methyl methacryl) resin the Ti coupling agent listed in Table 5 was added. The mixture was agitated at a temperature of 25° C. and the copper powder having a size of 1.5 μm was mixed thereinto. The mixture was mixed by a wet ball mill mixing and, after drying, the mixture was mixed or kneaded in a three roll mill to produce the desired copper-base composition in the form of a paste.

The paste compositions thus prepared were applied, in the same manner as in Example 1, to borosilicate glass-alumina composite ceramic substrate. The evaluation was carried out in the same manner as in Example 1. The results of the sheet resistivity, the adhesion strength to the substrate, and hole filing property are shown in Tables 6 and 7.

TABLE 6

Characteristics of Copper Paste after Firing

| Paste Composition Sample No. | Sheet Resistivity (mΩ□) | Adhesion Strength to Substrate (kg/mm²) |
|---|---|---|
| 1 | 1.0 | 1.6 |
| 2 | 1.0 | 1.6 |
| 3*1 | 1.0 | 0.5 |
| 4*2 | 1.5 | 2.0 |
| 5*3 | 1.2 | 0 |
| 6*4 | 1.0 | 0 |

*1: No coupling agent was contained in the paste listed in Table 5
*2: 10 phr glass frit (i.e., borosilicate glass having a softening point of 700° C.) was contained in the paste listed in Table 5.
*3: Commercially available copper-base paste for alumina ESL 2310
*4: Commercially available copper-base paste for alumina Remex 53 × 3(Remex Co.)

TABLE 7

| Paste Sample No. | Hole-Filling of Copper Paste to Glass-Ceramic Green Sheet | |
|---|---|---|
| | Hole-Filling Percentage*2 (100 μmφ, v = 1000) | Hole-Filling Conditions*3 |
| 1 | 99.0% | Good |
| 2 | 99.0% | Good |
| 3*1 | 90.0% | Good |
| 4*1 | 60.0% | Void in Via |
| 5*1 | 99.0% | Void in Via |
| 6*1 | 90.0% | Good |

*1: See Footnote of Table 6
*2: Conditions of the upper and lower portions of through-holes were visually observed after filling the paste into the through-holes by a screen printing method.
*3: After the paste was 100% filled into through-holes of the green sheets, the green sheets were evaluated and fired. Thereafter, the through-hole portions were vertically cut and, after polishing, the filling conditions were visually and microscopically evaluated, Furthermore, when isopropyl tridodecylbenzene sulfonyl titanate and isopropyl triisostearoyl titanate are used together, the improvement in the adhesion strength was obtained when 0.5 parts by weight or more of isopropyl tridodecylbenzene sulfonyl titanate was used and the improvement in the flowability was obtained when 0.5 parts by weight or more of isopropyl triisostearoyl titanate was used. On the other hand, the upper limit of the total amount of the isopropyl tridodecylbenzene sulfonyl titanate and isopropyl triisostearoyl titanate is preferably 4 parts by weight, because, when the total amount is more than 4 parts by weight, the organic content in the paste composition becomes large and the generation of voids around the via is liable to occur after firing the multilayer circuit board.

EXAMPLE 4

The copper-base paste compositions were prepared in the same manner as in Example 1, except that acetoalkoxy aluminum diisopropylate was used instead of the titanate.

The sheet resistivities of the resultant conductors were 1.2 mΩ/□, the adhesion strength was more them 3.2 kg/mm², and the printing properties were better than those of the titanate. The leveling properties were good and the minimum pattern widthes were 80 μm. The acetoalkoxy aluminum diisopropylate was converted to $Al_2O_3$ after firing.

We claim:

1. A method for producing a ceramic circuit board comprising the steps of (i) forming a conductor portion of the ceramic circuit board by printing a conductive paste composition on at least one ceramic base plate for the ceramic circuit board and then (ii) firing said ceramic circuit board together with said conductive paste composition printed thereon, said paste composition consisting essentially of (a) a copper powder, (b) a vehicle composed of an organic thermally depolymerizable binder, and (c) 0.5 to 3.5 parts by weight of isopropyl tridodecylbenze sulfonyl titanate and 0.5 to 3.5 parts by weight of isopropyl triisostearoyl titanate, both based on 100 parts by weight of the copper powder.

2. A method as claimed in claim 1, where said base plate is a ceramic green sheet.

3. A method as claimed in claim 1, wherein plural ceramic base plates each having the conductive paste composition printed thereon are laminated before firing.

* * * * *